United States Patent [19]

Wallace, Jr.

[11] 4,015,148

[45] Mar. 29, 1977

[54] HALL EFFECT DEVICE FOR USE IN OBTAINING SQUARE OR SQUARE ROOT OF A VOLTAGE AMPLITUDE

[75] Inventor: Robert Lee Wallace, Jr., Warren, N.J.

[73] Assignee: Bell Telephone Laboratories, Incorporated, Murray Hill, N.J.

[22] Filed: May 5, 1976

[21] Appl. No.: 683,499

[52] U.S. Cl. .................................. 307/309; 330/63; 357/27

[51] Int. Cl.² ................. H03K 17/90; H03K 19/18; H01L 27/22; H01L 29/82

[58] Field of Search ..................... 307/309; 357/27; 330/63

[56] References Cited

UNITED STATES PATENTS

| | | | |
|---|---|---|---|
| 3,683,127 | 8/1972 | Hori | 357/27 |
| 3,731,123 | 5/1973 | Matsushita | 357/27 |
| 3,800,193 | 3/1974 | Ashar et al. | 357/27 |
| 3,811,075 | 5/1974 | Shiga | 357/27 |
| 3,916,428 | 10/1975 | Kuninobu et al. | 357/27 |

*Primary Examiner*—Andrew J. James
*Attorney, Agent, or Firm*—H. L. Logan

[57] ABSTRACT

In accordance with the Hall effect, a magnetic field applied perpendicular to the direction of current flow through a conductor causes an electric field perpendicular to both the direction of the current flow and the direction of the magnetic field established in the conductor. This effect has been used to produce magnetic field and current detectors, modulators and frequency doublers. In accordance with the present disclosure a portion of the magnetic field is reversed to produce squaring of or obtaining the square root of the amplitude of the voltage used to produce the conductor current.

2 Claims, 3 Drawing Figures

HALL EFFECT DEVICE FOR USE IN OBTAINING SQUARE OR SQUARE ROOT OF A VOLTAGE AMPLITUDE

BACKGROUND OF THE INVENTION

1. Field of the Invention

This invention relates to semiconductor signal translating devices and, in particular, to semiconductor devices utilizing the Hall effect.

2. Description of the Prior Art

The Hall effect was discovered by E. H. Hall in 1879 during an investigation of the effects produced by placing a current carrying conductor in a magnetic field. In particular, Hall discovered that when a magnetic field is applied perpendicular to the direction of current flow through a conductor, an electric field perpendicular to both the direction of the current flow and the direction of the magnetic field is established in the conductor.

Since Hall's discovery, various devices utilizing the Hall effect have been produced. These devices include magnetic field and current detectors, modulators and frequency doublers.

SUMMARY OF THE INVENTION

An object of the invention is to use the Hall effect to either square or obtain the square root of the amplitude of a voltage.

The simplest of Hall effect devices comprises a semiconductive material, a magnet for producing a magnetic field in the material, a first pair of terminals connected to the material so that the straight line path between the terminals is substantially perpendicular to the magnetic field and a second pair of terminals connected to the material so that the straight line path between these terminals is substantially perpendicular to both the magnetic field path and the path of the first terminals. A voltage applied between one pair of terminals produces a current flow which results in a voltage between the other pair of terminals, where the voltage magnitude is proportional to the product of the input voltage magnitude and the strength of the magnetic field in the material.

In accordance with the present invention, the above-described structure is modified so that the output voltage magnitude is a function of the square of the magnitude of the input voltage. The present invention achieves this result by establishing in a portion of the semiconductive material a second magnetic field which is substantially parallel to the first field but opposite in direction. Furthermore, this second field is established so that the first and second fields each intercept portions of the two paths between the terminals.

In a preferred embodiment of the invention, the semiconductive material is in the form of a square-shaped slab. The two terminals of the first pair of terminals are connected at the midpoints, respectively, of two opposite edges of the slab while the two terminals of the second pair of terminals are connected at the midpoints, respectively, of the other two opposing edges. The slab resides between the jaws of first and second horseshoe-shaped magnets so that the magnets encompass respective portions of the slab defined by a diagonal drawn between a pair of diagonally opposite corners of the slab. Furthermore, the magnets are oppositely poled with respect to one another.

DETAILED DESCRIPTION

Figure 1:
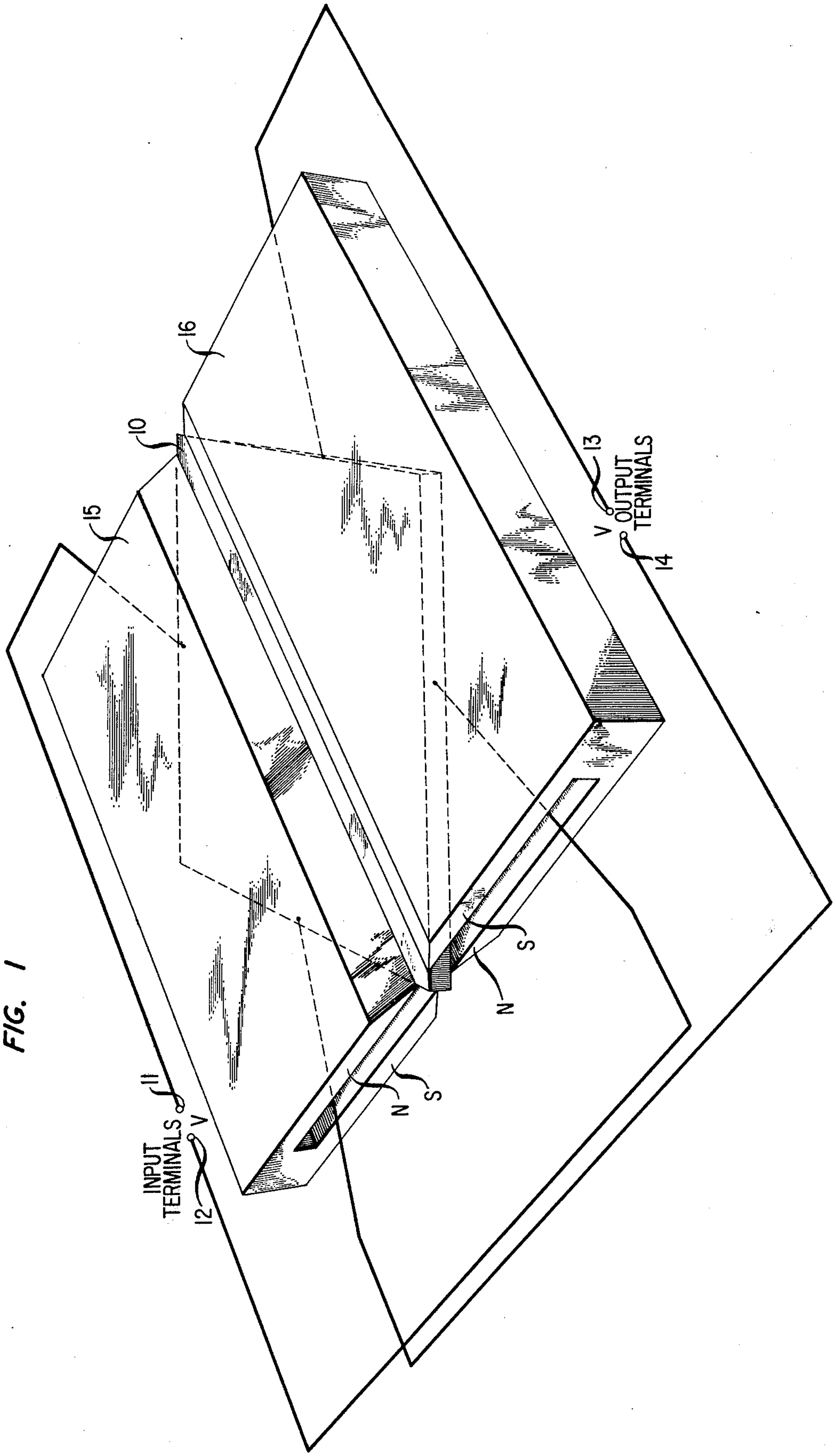
FIGS. 1 and 2 depict embodiments of the invention.

One embodiment of the invention is shown in FIG. 1. This embodiment comprises a square-shaped slab of semiconductor material 10 with input terminals 11 and 12 connected to midpoints, respectively, on opposite edges of material 10 and output terminals 13 and 14 connected to midpoints, respectively, on the remaining edges of material 10. One corner of material 10 extends into a horseshoe-shaped permanent magnet 15 while the opposite corner extends into a horseshoe-shaped permanent magnet 16. The jaws of magnets 15 and 16 are substantially parallel to a diagonal line which may be drawn between the remaining two corners of material 10. Furthermore, these two sets of jaws are in close proximity to such a line. Still further, the widths of the magnets are substantially equal to such a line, whereby the major portion of material 10 is enclosed by magnets 15 and 16. Finally, the two magnets are poled oppositely with respect to one another as indicated by the "N" and "S" letters which indicate north and south poles, respectively.

If the simplest of Hall effect devices were produced by removing magnet 16 of FIG. 1 and extending magnet 15 to encompass material 10, then the amplitude of the voltage at output terminals 13 and 14 would equal the amplitude of a voltage applied to input terminals 11 and 12 multiplied by a constant determined by the flux strength, the composition of material 10 and other characteristics which remain substantially constant. This could be expressed as $$v_{out} = k\, v_{in}\,.$$

When, however, an opposing field is introduced as taught herein, the output voltage amplitude is then substantially equal to a constant times the square of an input voltage amplitude. This may be expressed as $$v_{out} = k(v_{in})^2\,.$$

This squaring effect vanishes when material 10 is rotated either clockwise or counterclockwise by 45 degrees so that the opposing fields do not each intercept both a straight line path between input terminals 11 and 12 and a straight line path between output terminals 13 and 14.

The constant term is the last-mentioned equation may be eliminated, as appreciated by those skilled in the art, by dividing the output voltage appearing on terminals 13 and 14 by the constant *k*.

Permanent magnets 15 and 16 may be replaced by electromagnets which are energized in an opposing sense so that at any instant of time they are producing opposing field in material 10. In such a mode of operation, modulation takes place with the modulating term in the output being the square of the modulating input.

By placing the input and output terminal connections to material 10 at respective corners of the material, the material may then be placed within magnets 15 and 16 so that their outer edges are parallel. This is shown in FIG. 2 wherein the upper portions of the magnets have been broken away for purposes of illustration.

Figures 2, 3:
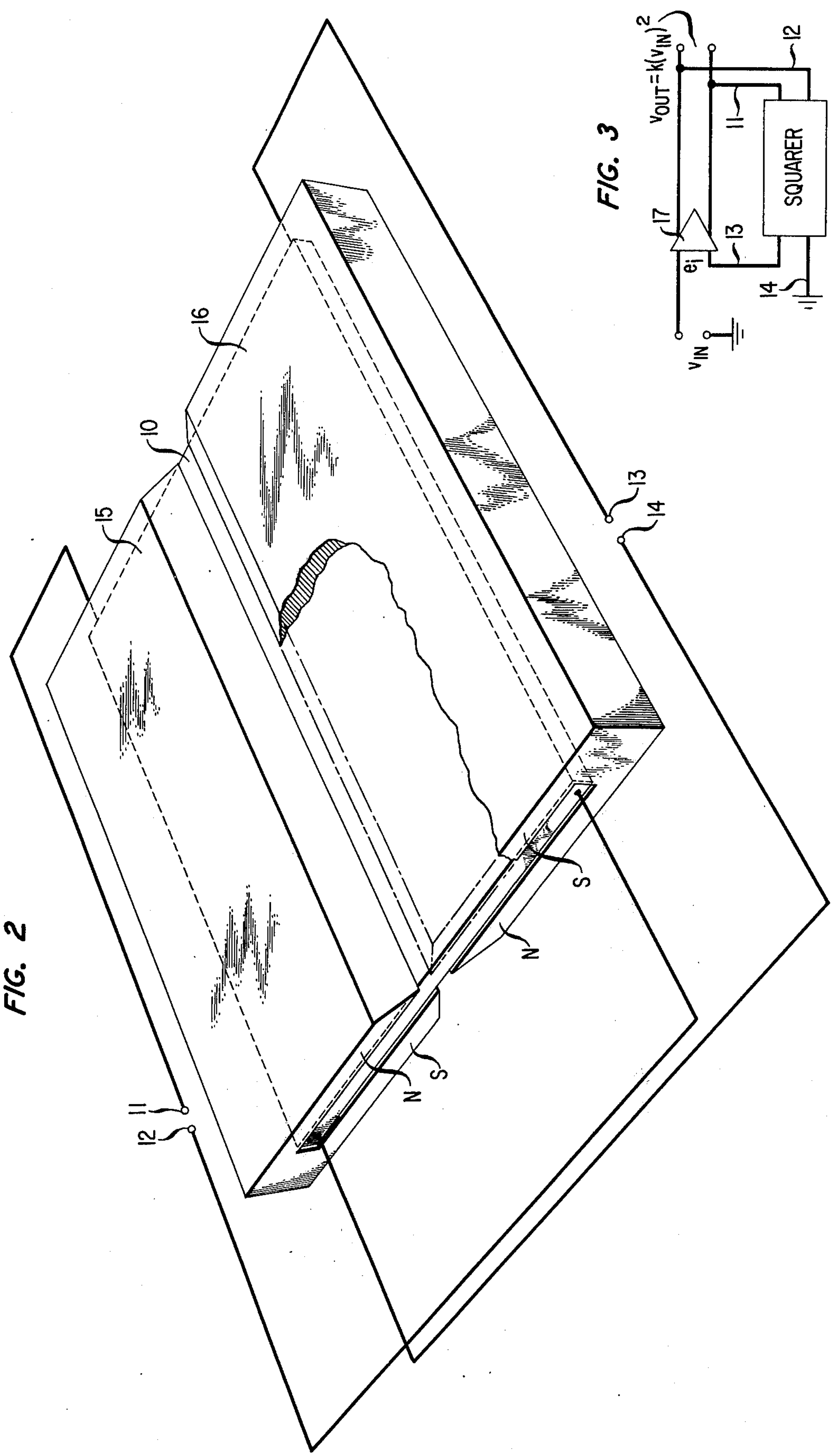
FIG. 3 shows the use of embodiments of the invention in a square rooting circuit.

The use of an embodiment of the invention for obtaining the square root of an input voltage amplitude is shown in FIG. 3. In FIG. 3, an input voltage is applied between one input terminal of a differential amplifier 17 and ground. The output of amplifier 17 is applied to input terminals 11 and 12 of an embodiment of the invention, while the output at terminals 13 and 14 of the embodiment are applied between the remaining input terminal of amplifier 17 and ground. As long as the output applied to the amplifier by the embodiment is much, much greater than the difference between the two inputs to the amplifier, the output of the amplifier will substantially equal the square root of the input voltage times a constant. The constant term is readily eliminated by dividing the output of the amplifier by the constant.

What is claimed is:

1. In a Hall effect device comprising semiconductive material, a magnet establishing a magnetic field which passes in a first direction through said material, a pair of terminals connected to said material so that the straight line path therebetween is substantially perpendicular to the path of said magnetic field, and a second pair of terminals connected to said material so that the straight line path therebetween is substantially perpendicular to both said magnetic field path and said path of said first terminals, AN IMPROVEMENT CHARACTERIZED IN THAT means are provided for reversing a portion of said magnetic field where said portion intersects part of the straight line path between said first pair of terminals and also part of the straight line path between said second pair of terminals.

2. A Hall effect device comprising a semiconductor, a first structure to establish a magnetic field in a first direction through a first portion of said semiconductor, a second structure to establish a magnetic field in a second portion of said semiconductor in a second direction substantially opposite to said first direction, a first pair of terminals connected to said semiconductor so that the straight line path between said first pair of terminals passes through both of said fields and, furthermore, is substantially perpendicular to said fields, and a second pair of terminals connected to said semiconductor so that the straight line path between said second pair of terminals passes through both of said fields and, furthermore, is substantially perpendicular to both said fields and the first-mentioned straight line path.

* * * * *